US007891987B2

(12) United States Patent
Takeuchi

(10) Patent No.: US 7,891,987 B2
(45) Date of Patent: Feb. 22, 2011

(54) ELECTRIC JUNCTION BOX

(75) Inventor: Kunihiko Takeuchi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/085,209

(22) Filed: Mar. 22, 2005

(65) Prior Publication Data

US 2005/0208793 A1 Sep. 22, 2005

(30) Foreign Application Priority Data

Mar. 22, 2004 (JP) ............................ 2004-082615

(51) Int. Cl.
*H01R 12/00* (2006.01)
*H05K 1/00* (2006.01)

(52) U.S. Cl. ..................................................... 439/76.2

(58) Field of Classification Search ................ 439/76.2, 439/701, 731, 696, 687, 724, 680, 364, 540.1, 439/638; 174/50, 520, 53, 57–59
See application file for complete search history.

(56) References Cited

U.S. PATENT DOCUMENTS 3,447,036 A * 5/1969 Dore et al. .................. 439/701
6,022,247 A * 2/2000 Akiyama et al. ............ 439/701
6,773,271 B2 * 8/2004 Falchetti ..................... 439/76.2
6,964,585 B2 * 11/2005 Blichasz et al. ............. 439/638

FOREIGN PATENT DOCUMENTS

JP 9-284921 10/1997

* cited by examiner

*Primary Examiner*—Felix O Figueroa
(74) *Attorney, Agent, or Firm*—Kratz, Quintos & Hanson, LLP

(57) ABSTRACT

The electric junction box includes a box body, cassette block, relay, terminal fitting and rib. The box body includes a mounting hole. A groove is formed hollow from a surface of the cassette block. The relay is mounted on the surface of the cassette block. The terminal fitting is received in the cassette block. The rib extends from one inner wall surface to an opposite inner wall surface of the mounting hole. The cassette block is received in the mounting hole of the box body. The rib enters into the groove.

8 Claims, 4 Drawing Sheets

ELECTRIC JUNCTION BOX

BACKGROUND OF THE INVENTION (1) Field of the Invention

The present invention relates to an electric junction box, which is mounted on a motor vehicle and so on as a mobile unit.

(2) Description of the Related Art

Generally, various electronic equipment such as lamps such as a head lamp and tail lamp, and motors such as a starter motor and motor for an air-conditioner is mounted on a motor vehicle as a mobile unit.

In order to supply electric power to various equipment described above, a junction block has been arranged on a suitable position in a motor vehicle. The junction block is constructed in such a manner that various electric circuit units, such as many fuses and relays, are put together.

In this connection, since the junction block may includes fuses, relays and busbars therein, the junction block is sometimes called a fuse block, relay box or electric junction box as a generic name. In this specification, such a fuse block, relay box or junction block is called an electric junction box as a generic name.

The electric junction box includes a box body forming an outline of the electric junction box, electrical components block mounted in the box body and so on. The box body is formed in a box-shape. The electrical components block includes electrical components such as fuses and relays, which are mounted in the box body, and terminal fittings attached to ends of electric wires.

The terminal fitting is attached to the box body so as to be electrically and mechanically connected to a terminal of an electric component mounted in the box body. The terminal fitting electrically connects an electric wire to an electrical component. An electric wire attached to the terminal fitting is connected to the electronic equipment. The electric junction box constructed as described above electrically connects an electric wire, to which the terminal fitting is attached, to the electrical component such as a relay or fuse according to a predetermined pattern.

The terminal fittings, to which electric wires are attached, as electrical components and electrical components such as relays and fuses are mounted in the box body one by one, thereby the electric junction box is assembled. Therefore, the assembly needs a lot of time and man-hour.

In Japanese Patent Application Laid-Open No. H9-284921, proposed is an electric junction box, in which the box body is provided with a detachable cassette block in which the terminal fittings, relays and fuses are mounted. Such a cassette block is mounted in the box body so that the electrical components such as terminal fittings, relays and fuses are collectively mounted in the box body, thereby reducing time and man-hour for assembly.

The box body of the electric junction box disclosed in Japanese Patent Application Laid-Open No. H9-284921 includes a mounting hole for receiving the cassette block described above. The box body is made of electrically insulating synthetic resin and molded by a known injection molding or the like. The mounting hole is formed being surrounded with a plurality of walls that construct the box body.

Therefore, if the number of the electrical components to be mounted in the cassette block is increased or the size of the electrical component is increased, the rigidity of the box body tends to deteriorate since the box body includes the mounting hole for receiving the cassette block. Therefore, when the cassette block is inserted into the mounting hole, the box body is distorted, causing difficulty in the insertion of the cassette block into the mounting hole.

Moreover, since the box body is made of synthetic resin and molded by a known injection molding or the like, the box body might be distorted when the molded box body is subjected to injection molding or removed from a mold. In such case, of course, the insertion of the cassette block into the mounting hole becomes difficult.

SUMMARY OF THE INVENTION

It is therefore an objective of the present invention to solve the above problem and to provide an electric junction box, so that the cassette block, in which electrical components are mounted, can be easily inserted into the mounting hole of the box body.

In order to attain the above objective, the present invention is to provide an electric junction box including:

a box body including a mounting hole;

a cassette block received in the mounting hole; and a rib extending from one inner wall surface to an opposite inner wall surface of the mounting hole.

With the construction described above, one end of the rib continues to the one inner wall surface of the mounting hole while an opposite end of the rib continues to the opposite inner wall surface of the mounting hole. Therefore, the rigidity of the mounting hole, that is, the rigidity of the box body is improved so as to be hardly distorted, and the mounting hole is hardly distorted, that is, the box body is hardly distorted when the box body is molded. Since the box body is hardly distorted, therefore the cassette block, in which the electric components are mounted, can be easily mounted in the mounting hole.

Preferably, the electric junction box further includes a plurality of electric components mounted in the cassette block, wherein the rib is arranged at a position between the electric components adjacent to each other out of a plurality of the electric components mounted in the cassette block.

With the construction described above, the rib is prevented from interfering with the electric components mounted in the cassette block. Therefore, the cassette block can be easily mounted in the mounting hole and the mounting hole can be made compact, that is, the box body can be made compact.

Preferably, the cassette block includes a groove, into which the rib enters when the cassette block is mounted in the box body.

With the construction described above, the rib enters into the groove, thereby preventing the box body from being distorted after the cassette block is mounted, that is, preventing the electric junction box from being distorted after the cassette block is mounted. Further, since the rib enters into the groove, therefore the box body can be made compact, that is, the electric junction box can be made compact. The cassette block can be easily mounted in the mounting hole.

Preferably, the groove is formed on a surface of the cassette block.

With the construction described above, the cassette block can be securely mounted in the box body after the electric components are mounted in the cassette block. Therefore, the electric junction box can be easily assembled with reducing time and man-hour for the assembly.

DESCRIPTION OF THE PREFERRED EMBODIMENTS

Figure 1:
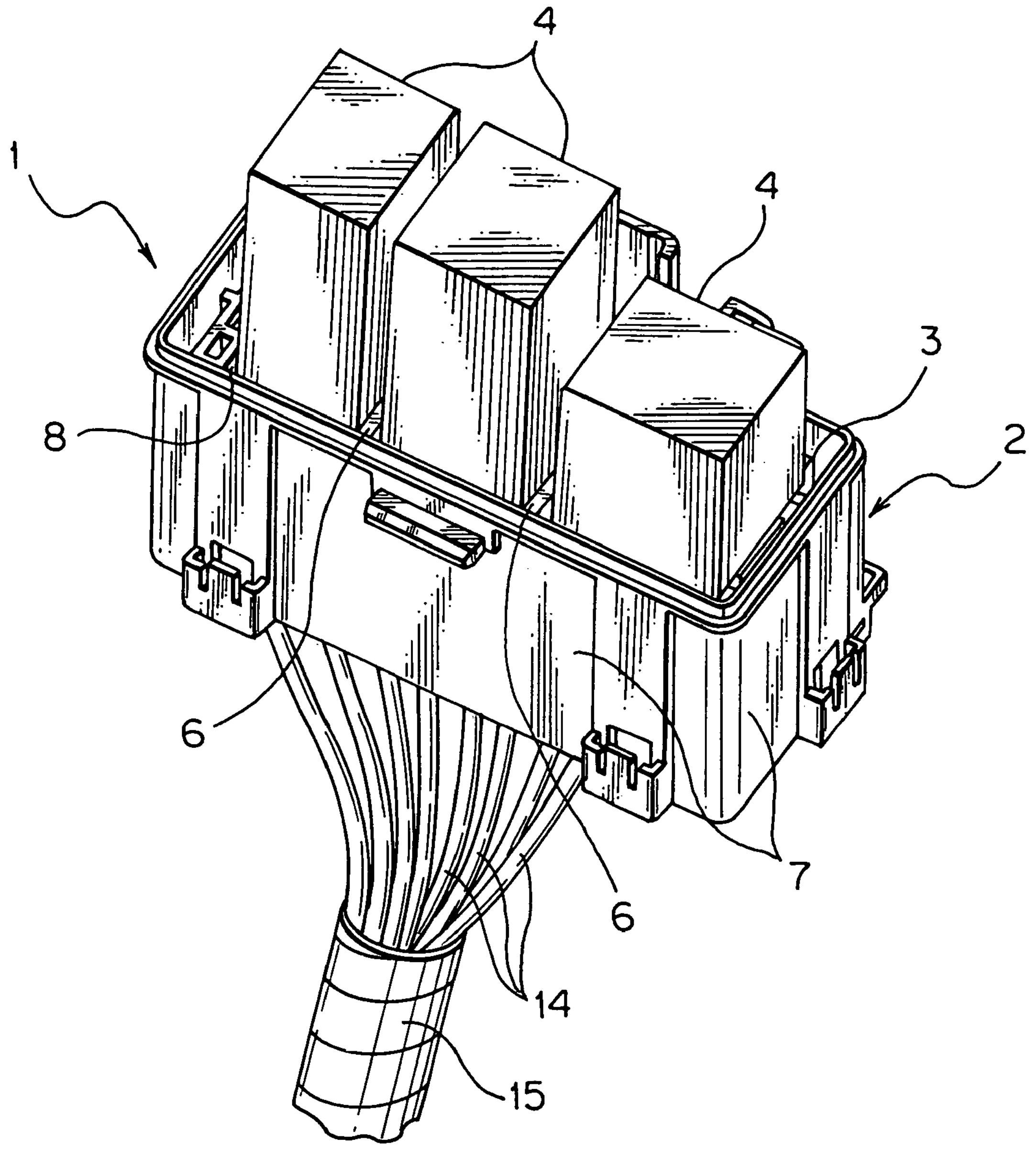
FIG. 1 is a perspective view illustrating an electric junction box according to a preferred embodiment of the present invention.
Figure 2:
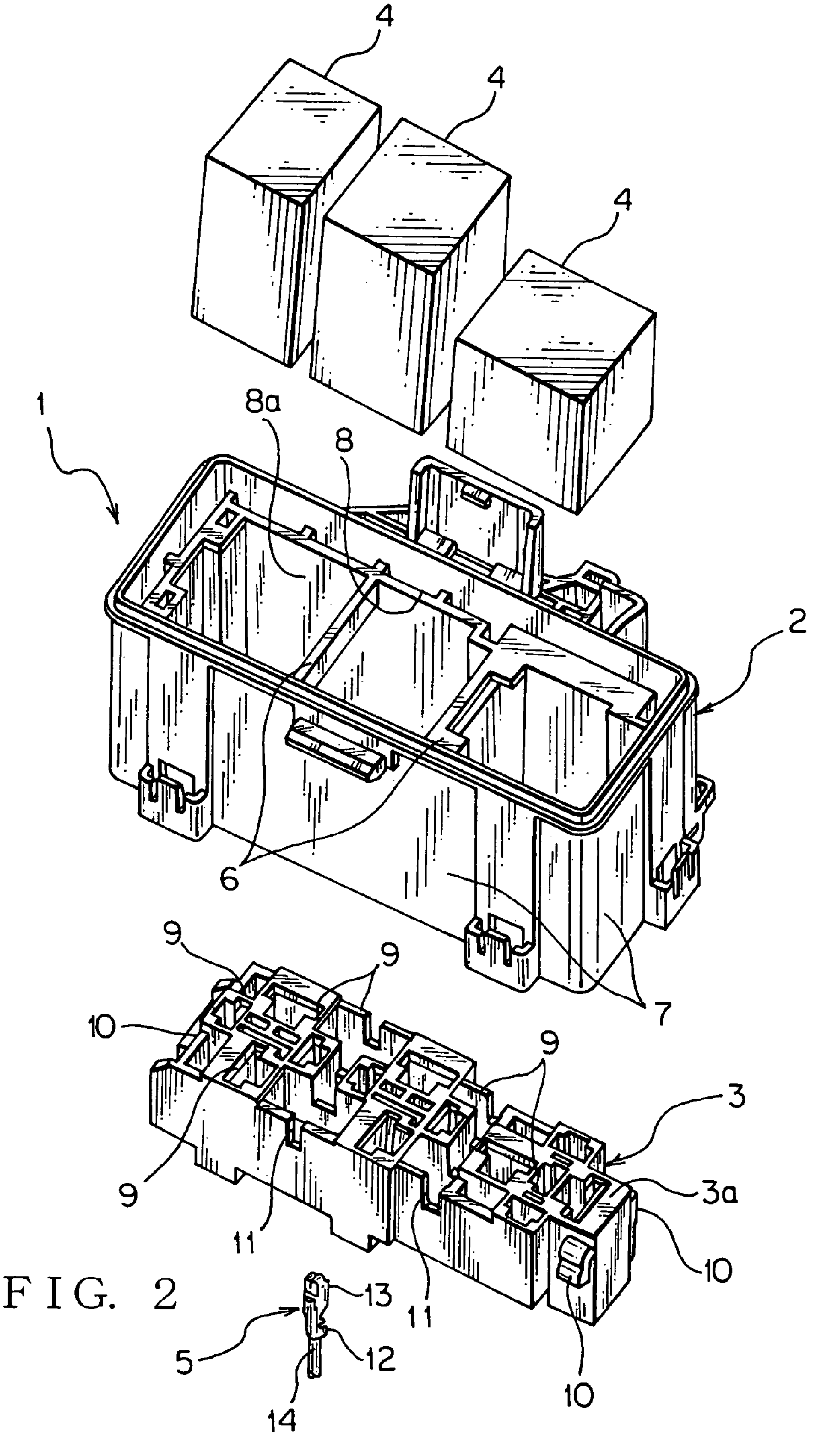
FIG. 2 is an exploded perspective view of the electric junction box shown in FIG. 1.

In the following, an electric junction box according to a preferred embodiment of the present invention will be explained with reference to FIGS. 1-4C. The electric junction box 1 shown in FIG. 1 is mounted on a motor vehicle as a mobile unit. As shown in FIGS. 1 and 2, the electric junction box 1 includes a box body 2, cassette block 3, a plurality of relays 4, a plurality of terminal fittings 5 (only one terminal fitting being shown only in FIG. 2), and a plurality of ribs 6.

The box body 2 is made of electrically insulating synthetic resin and molded by known injection molding. The box body 2 is formed in a tube-shape (box-shape) with a plurality of outer walls 7. The box body 2 is provided with a mounting hole 8. The mounting hole 8 is a space surrounded by a plurality of the outer walls 7 that construct the box body 2. Both ends situated at the top and bottom of the mounting hole 8 shown in FIGS. 1 and 2 are open. That is, the box body 2 is formed in a tube-shape (frame-shape). Opposite engaging parts (not shown in the figure) are formed on respective inner surfaces of the mounting hole 8, wherein engaging parts 10 (mentioned later on) of the cassette block 3 engage with the corresponding opposite engaging parts.

The parallel to is formed in a box-shape having such a size that it can be received in the mounting hole 8. The cassette block 3 is inserted into the mounting hole 8 passing through an opening situated at the bottom of the mounting hole 8 in FIGS. 1 and 2. The cassette block 3 includes a plurality of terminal-receiving chambers 9 and a plurality of the engaging parts 10. Each terminal-receiving chamber 9 is a straight line-shaped space formed within the cassette block 3. The longitudinal directions of the respective terminal-receiving chambers 9 are parallel to one another and also parallel to the direction in which the cassette block 3 is inserted into the mounting hole 8. Both ends situated at the top and bottom of the terminal-receiving chamber 9 shown in FIGS. 1 and 2 are open.

Figure 3:
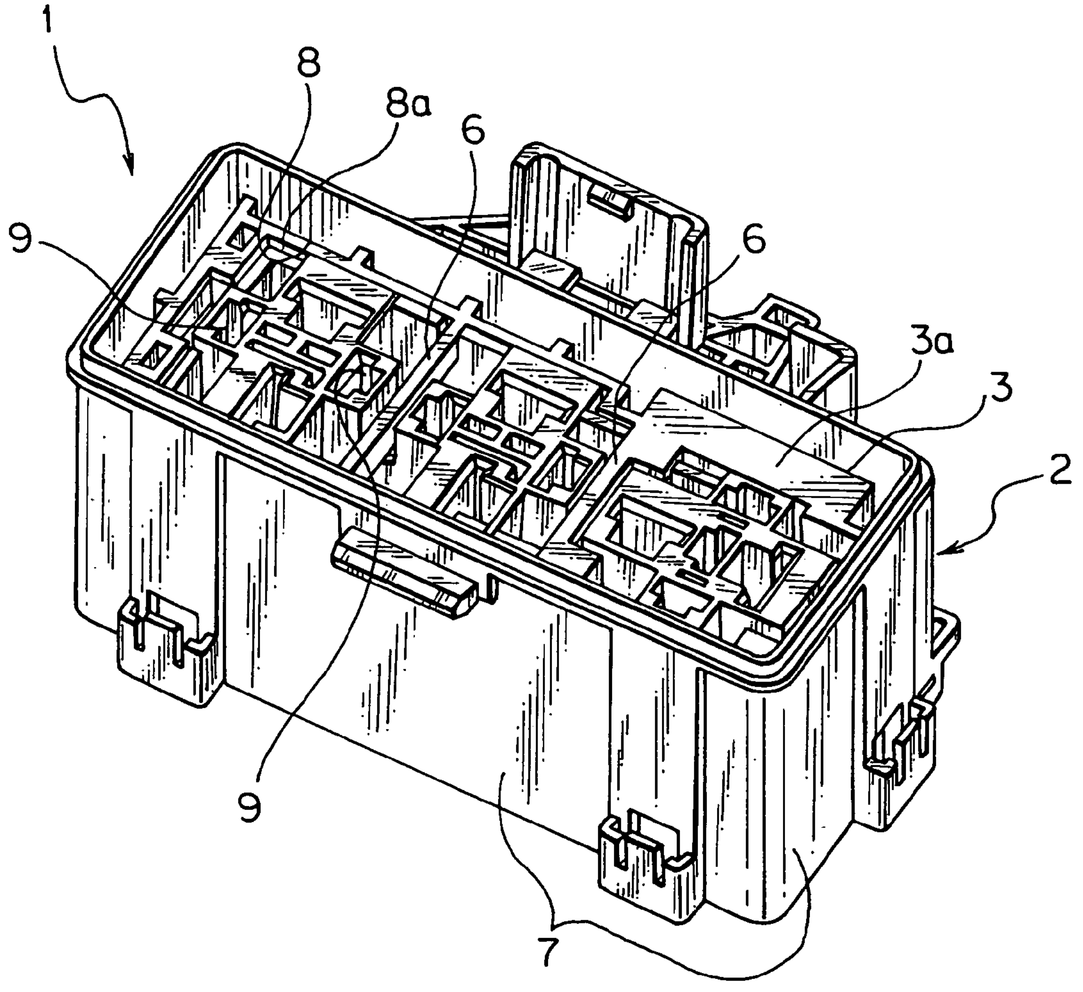
FIG. 3 is a perspective view illustrating a state when a cassette block is mounted in a box body of the electric junction box shown in FIG. 2.

Each engaging part 10 is formed protruding from an outer surface of the cassette block 3 and engages with the corresponding opposite engaging part formed on the box body 2. The cassette block 3 is inserted in the mounting hole 8 through the opening described above. Then, the engaging parts 10 engage with the respective opposite engaging parts, thereby the cassette block 3 is fixed to the box body 2 as shown in FIG. 3. Thus, the cassette block 3 is fixed to the box body 2 being received in the mounting hole 8.

As shown in FIG. 2, the cassette block 3 is provided with grooves 11 on its surface 3*a* situated near to the box body 2. Each groove 11 is formed hollow extending straight from the corresponding surface 3*a* of the cassette block 3. The grooves 11 are formed correspondingly to the ribs 6. When the cassette block 3 enters into the mounting hole 8 passing through the opening described above, the ribs enter into the respective grooves 11.

The relays 4 are mounted on the surface 3*a* of the cassette block 3, the surface 3*a* being situated at the upper side of cassette block 3 in FIGS. 1 and 2. The relays 4 are the electric components.

Each terminal fitting 5 is made of electrically conductive metal plate and integrally includes an electric wire-connecting part 12 and an electric contact 13. An electric wire 14 is attached to the electric wire-connecting part 12. The electric wire-connecting part 12 is electrically and mechanically connected to a core wire of the electric wire 14. The electric wire 14 is a so-called coated wire including an electrically conductive core wire and insulating coating. A plurality of element wires are twisted together so as to form the core wire. Each element wire is made of electrically conductive metal. The insulating coating of the electric wire 14 is made of insulating synthetic resin and coats the core wire.

When the terminal fitting 5 is attached to the cassette block 3 and the cassette block 3 is mounted in the box body 2, the electric contact 13 is attached to a terminal (not shown in the figure) of the relay 4. The electric contact 13 is electrically and mechanically connected to the terminal (not shown in the figure) of the relay 4.

After the electric wire 14 is attached to the electric wire-connecting part 12, the terminal fitting 5 is inserted into the terminal-receiving chamber 9 through an opening situated at the lower side of the terminal-receiving chamber 9. After the terminal fitting 5 is received in the terminal-receiving chamber 9, the terminal fitting 5 is fixed to the box body 2. When the terminal fitting 5 is received in the terminal-receiving chamber 9 and the cassette block 3 is mounted in the box body 2, the terminal fitting 5 positions the electric contact 13 near to the box body 2 in the terminal-receiving chamber 9 and also positions the electric wire-connecting part 12 at the side apart from the box body 2. The terminal fitting 5 is the electric component.

Each rib 6 is formed in a bar-shape extending straight. Both ends of the rib 6 continue to the corresponding inner wall surfaces 8*a* facing each other of the mounting hole 8. When the cassette block 3 is mounted in the box body 2, the rib 6 is arranged at a position between the relays 4 adjacent to each other out of a plurality of the relays 4 mounted in the cassette block 3.

Both ends of the rib 6 continue to the corresponding inner wall surfaces 8*a* facing each other of the mounting hole 8, the rib 6 extending along the width direction of the box body 2, which width direction crosses at right angles with the longitudinal direction of the box body 2. That is, the longitudinal direction of the rib 6 is parallel to the width direction of the box body 2. Thus, the rib 6 is continuously formed between the inner wall surfaces 8*a* facing each other of the mounting hole 8. In a state that the cassette block 3 is mounted in the box body 2, the rib 6 is formed at an edge on the side of the inner wall surface 8*a* of the mounting hole 8, the side being apart from the cassette block 3.

The electric junction box 1 having the constitution described above is assembled as follows. First, the electric wire 14 is attached to the electric wire-connecting part 12 of each terminal fitting 5. Then, the terminal fitting 5 is inserted into the terminal-receiving chamber 9 through the opening. When the cassette block 3 is mounted in the box body 2, the electric contact 13 is positioned near to the box body 2 in the terminal-receiving chamber 9 while the electric wire-connecting part 12 is positioned at the side in the terminal-receiving chamber 9, the side being apart from the box body 2. Thus, the terminal fitting 5 is inserted in the corresponding terminal-receiving chamber 9.

Figure 4A:
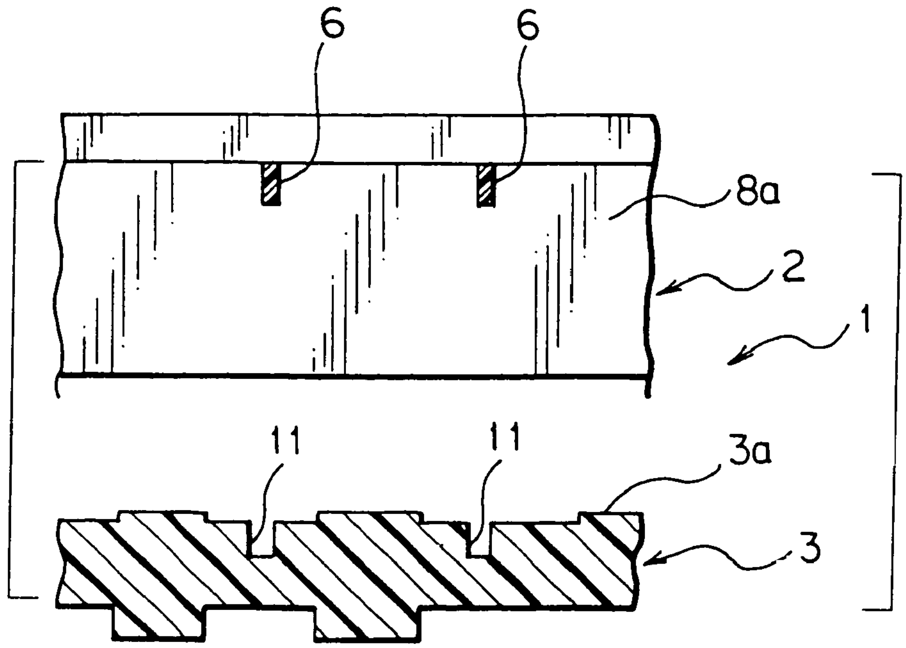
FIGS. 4A-4C are views illustrating change in relative positional relation between the rib and groove when the cassette block is being mounted in the box body shown in FIG. 3.
Figure 4B:
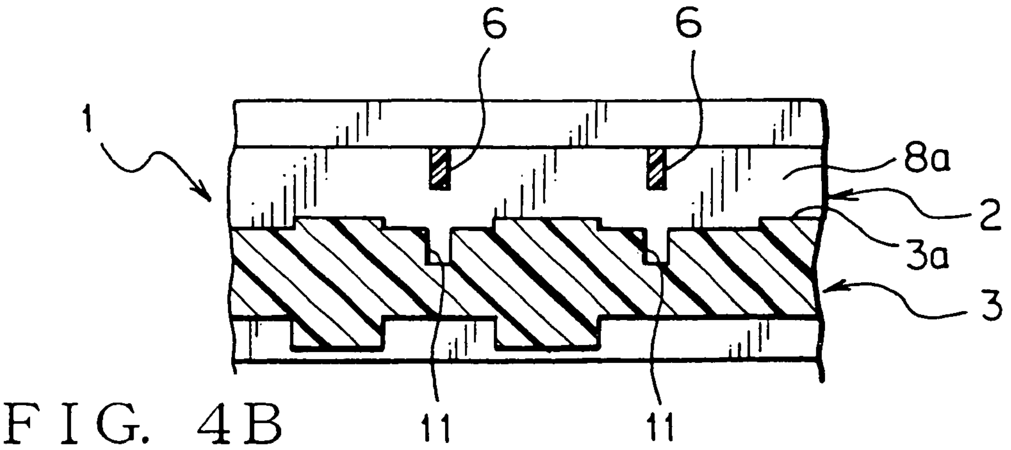
Figure 4C:
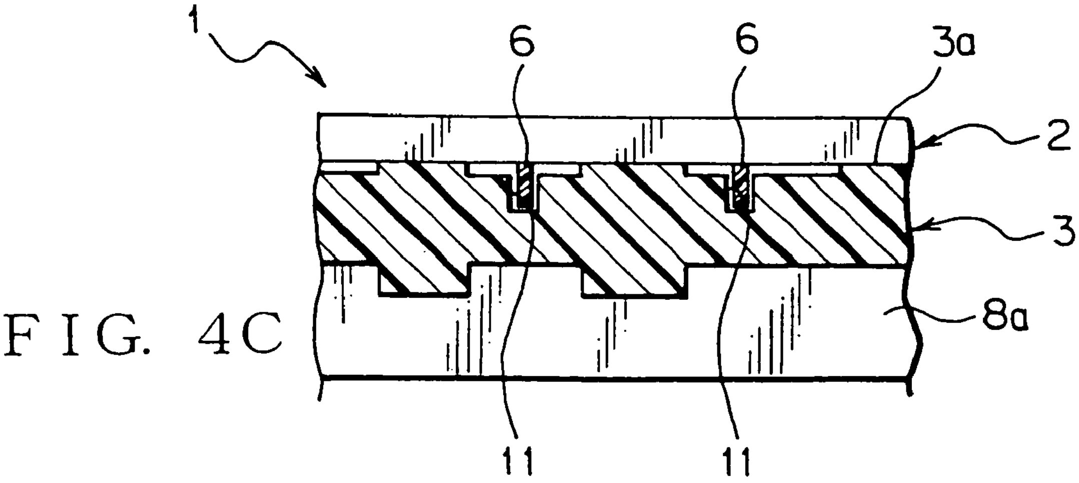

Then as shown in FIG. 4A, the cassette block 3 is faced to the opening of the mounting hole 8 and then, as shown in FIG. 4B, the cassette block 3 is gradually inserted into the mounting hole 8 through the opening. At this time, the ribs 6 gradually enter into the corresponding grooves 11. Then, the engaging parts 10 engage with the corresponding opposite engaging parts of the box body 2, and as shown in FIG. 4C, the ribs 6 enter in the corresponding grooves 11, so that the cassette block 3 is fixed to the box body 2.

Then, each relay 4 is mounted on the corresponding surface 3*a* of the cassette block 3. Then, the terminal of the relay 4 is electrically and mechanically connected to the corresponding electric contact 13 of the terminal fitting 5. Thus, the electric junction box 1 electrically connects the relays 4 to the corresponding electric wires 14 according to a predetermined pattern through the terminal fittings 5 and so on.

In the electric junction box 1, each electric wire 14 is wound with a tape 15 (shown in FIG. 1). The electric junction box 1 is received in a waterproof casing (not shown in the figure) and fixed on a panel which constitutes a body of a motor vehicle. The electric wires 14 are connected to the corresponding various electronic instruments mounted on the motor vehicle. Thus, the electric junction box 1 is mounted on the motor vehicle or the like so as to electrically connect the relays 4 to the corresponding various electronic instruments mounted on the motor vehicle according to a predetermined pattern.

In the preferred embodiment described above, both ends of the rib 6 continue to the corresponding inner wall surfaces 8*a* facing each other of the mounting hole 8, in which the cassette block 3 is mounted. Therefore, the rigidity of the mounting hole 8, that is, the rigidity of the box body 2 is improved so as to be hardly distorted, and the mounting hole 8 is hardly distorted, that is, the box body 2 is hardly distorted when the box body 2 is molded. Since the box body 2 is hardly distorted, therefore the cassette block 3, in which the relays 4 are mounted, can be easily mounted in the mounting hole 8.

Each rib 6 is arranged at a position between the relays 4 as the electric components adjacent to each other. Therefore, the rib 6 is prevented from interfering with the relays 4 as the electric components mounted in the cassette block 3. Therefore, the cassette block 3 can be easily mounted in the mounting hole 8 and the mounting hole 8 can be made compact, that is, the box body 2 can be made compact.

The cassette block 3 includes the grooves 11, into which the corresponding ribs 6 enter when the cassette block 3 is mounted in the box body 2. The rib 6 enters into the corresponding groove 11, thereby preventing the box body 2 from being distorted after the cassette block 3 is mounted, that is, preventing the electric junction box 1 from being distorted after the cassette block 3 is mounted. Further, since the rib 6 enters into the groove 11, therefore the thickness of the box body 2 along the insertion direction of the cassette block 3 into the mounting hole 8 can be reduced, that is, the thickness of electric junction box 1 along the insertion direction of the cassette block 3 into the mounting hole 8 can be reduced. That is, the box body 2 can be made compact, that is, the electric junction box 1 can be made compact.

The groove 11 is formed hollow from the surface 3*a* of the cassette block 3. Therefore, the cassette block 3 can be securely mounted in the box body 2 after the terminal fittings 5 as the electric components are mounted in the cassette block 2. Therefore, the electric junction box 1 can be easily assembled with reducing time and man-hour for the assembly.

In the preferred embodiment described above, explained is a case in which the relays 4 as the electric components are mounted in the cassette block 3. However, instead, in the present invention, other electric components such as fuses or fusible links may be mounted in the cassette block 3.

Further, in the preferred embodiment described above, the grooves 11 are formed on the surfaces 3*a* of the cassette block 3. However, instead, in the present invention, the grooves 11 may not be formed on the surfaces 3*a* of the cassette block 3.

Furthermore, in the preferred embodiment described above, the rib 6 is arranged at a position between the relays 4 adjacent to each other, the relays 4 being mounted in the cassette block 3. However, instead, in the present invention, the rib 6 may be arranged at various positions besides the aforementioned specific position.

The aforementioned preferred embodiments are described to aid in understanding the present invention and variations may be made by one skilled in the art without departing from the spirit and scope of the present invention.

What is claimed is:

1. An electric junction box comprising:

a box body that includes a plurality of outer walls and a mounting hole defined by the outer walls;

a cassette block received in the mounting hole, the cassette block corresponding to a single body, the cassette block including terminal-receiving chambers and a plurality of pairs of grooves that are opposed to each other, at least one of said pairs of grooves being formed hollow from upper end parts of mutually facing side walls of one of said terminal-receiving chambers of the cassette block, the at least one of said pairs of grooves extending through the mutually facing side walls of the one of said terminal-receiving chambers, wherein the mutually facing side walls are side walls of the single body;

a plurality of relays configured to be mounted on an upper side of the cassette block; and a plurality of ribs in a bar shape that extend straight from one inner wall surface of the mounting hole of the box body, and continue to and contact with an opposite inner wall surface of the mounting hole, said ribs being in one piece with the inner wall surfaces such that a space is provided under an underside of the ribs so as to receive the cassette block in the box body, said ribs configured to be at a position between the relays mounted on the upper side of the single body of the cassette block and to enter at least one pair of the grooves of the cassette block such that rigidity of the box body is imparted and distortion of the box body is prevented.

2. The electric junction box according to claim 1, wherein the ribs are arranged at a position between the relays adjacent to each other out of a plurality of the relays mounted in the cassette block.

3. The electric junction box according to claim 1, wherein the grooves are formed on a surface of the cassette block.

4. The electric junction box according to claim 2, wherein the grooves are formed on a surface of the cassette block.

5. An electric junction box comprising:

a box body that includes a plurality of outer walls and a mounting hole defined by the outer walls;

a cassette block received in the mounting hole, the cassette block corresponding to a single body, the cassette block including terminal-receiving chambers and a plurality of pairs of grooves that are opposed to each other, at least one of said pairs of grooves being formed hollow from upper end parts of mutually facing side walls of one of said terminal-receiving chambers of the cassette block, wherein the mutually facing side walls are side walls of the single body;

a plurality of relays configured to be mounted on an upper side of the single body of the cassette block; and a plurality of ribs in a bar shape that extend straight from one inner wall surface of the mounting hole of the box body, and continue to and contact with an opposite inner wall surface of the mounting hole, said ribs being in one piece with the inner wall surfaces such that a space is provided under an underside of the ribs so as to receive the cassette block in the box body, said ribs configured to be at a position between the relays mounted on the upper side of the single body of the cassette block and to enter at least one pair of the grooves of the cassette block such that rigidity of the box body is imparted and distortion of the box body is prevented, wherein at least one of said ribs extends into the mounting hole.

6. The electric junction box according to claim 5, wherein the ribs are arranged at a position between the relays adjacent to each other out of a plurality of the relays mounted in the cassette block.

7. The electric junction box according to claim 5, wherein the grooves are formed on a surface of the cassette block.

8. The electric junction box according to claim 6, wherein the grooves are formed on a surface of the cassette block.

* * * * *